(12) United States Patent
Morello et al.

(10) Patent No.: US 10,878,331 B2
(45) Date of Patent: Dec. 29, 2020

(54) QUANTUM LOGIC

(71) Applicant: NewSouth Innovations Pty Limited, New South Wales (AU)

(72) Inventors: Andrea Morello, Sydney (AU); Rachpon Kalra, Sydney (AU); Arne Laucht, Sydney (AU)

(73) Assignee: NewSouth Innovations Pty Limited, Sydney (AU)

( * ) Notice: Subject to any disclaimer, the term of this patent is extended or adjusted under 35 U.S.C. 154(b) by 455 days.

(21) Appl. No.: 14/420,979

(22) PCT Filed: Aug. 12, 2013

(86) PCT No.: PCT/AU2013/000886
§ 371 (c)(1),
(2) Date: Feb. 11, 2015

(87) PCT Pub. No.: WO2014/026222
PCT Pub. Date: Feb. 20, 2014

(65) Prior Publication Data
US 2015/0206061 A1  Jul. 23, 2015

(30) Foreign Application Priority Data
Aug. 13, 2012  (AU) ............................... 2012903473

(51) Int. Cl.
*G06N 10/00* (2019.01)
*B82Y 10/00* (2011.01)
(Continued)

(52) U.S. Cl.
CPC .............. *G06N 10/00* (2019.01); *B82Y 10/00* (2013.01); *G01R 33/44* (2013.01); *G01R 33/60* (2013.01)

(58) Field of Classification Search
CPC ...... G06N 99/002; G06N 10/00; B82Y 10/00; G01R 33/44; G01R 33/60
See application file for complete search history.

(56) References Cited

U.S. PATENT DOCUMENTS

| | | | |
|---|---|---|---|
| 6,472,681 B1* | 10/2002 | Kane ...................... | B82Y 10/00 257/14 |
| 2005/0117836 A1* | 6/2005 | Franson ................. | B82Y 10/00 385/15 |
| 2013/0087766 A1* | 4/2013 | Schenkel ............. | G06N 99/002 257/31 |

FOREIGN PATENT DOCUMENTS

WO   2009/100483 A1   8/2009

OTHER PUBLICATIONS

Kane, Bruce E. "A silicon-based nuclear spin quantum computer." nature 393.6681 (1998): 133-137.*
(Continued)

*Primary Examiner* — Miranda M Huang
*Assistant Examiner* — Kevin W Figueroa
(74) *Attorney, Agent, or Firm* — Wood, Phillips, Katz, Clark & Mortimer (57) ABSTRACT

This invention concerns a method to switch on and off the exchange interaction J between electron spins bound to donor atoms. The electron spins have the role of 'qubits' to carry quantum information, and the exchange interaction J has the role of mediator for two-qubit quantum logic operations. The invention aims at exploiting the existence of a further magnetic interaction, the hyperfine interaction A, between each electron spin and the nuclear spin of the donor atom (301, 302) that binds the electron. The hyperfine interaction A, together with the ability to read out (504) and control the state of the nuclear spins, is used to suppress the effect of the exchange interaction J at all times, except while a quantum logic operation is being performed. In this way, (Continued)

the result of the quantum logic operation is not distorted after the operation has taken place. In a further aspect, the invention concerns an electronic device where the method can be practically implemented, and a large scale device made up of many of the devices.

19 Claims, 8 Drawing Sheets

(51) Int. Cl.
  *G01R 33/60* (2006.01)
  *G01R 33/44* (2006.01)

(56) References Cited

OTHER PUBLICATIONS

Kane, Bruce E. "Silicon-based quantum computation." arXiv preprint quant-ph/0003031 (2000).*
Klauser, D., W. A. Coish, and Daniel Loss. "Quantum-dot spin qubit and hyperfine interaction." Advances in Solid State Physics. Springer, Berlin, (Year: 2008).*
Ng et al. "Introduction to Solid-State Quantum Computation for Engineers" Microelectronics Journal 33, pp. 171-177 (2002).
Kane B.E. "A Silicon-based Nuclear Spin Quantum Computer" Semiconductor Nanofabrication Facility, School of Physics, University of New South Wales, Australia.
Kane B.E. "Silicon-based Quantum Computation" Laboratory for Physical Sciences, University of Maryland (2008).
Fang et al. "Simulation of Si:P Spin-based Quantum Computer Architecture" Department of Electrical and Computer Engineering, University of Illinois at Urbana-Champaign (2008).
Kane B.E. et al. "Single Spin Measurement Using Single-electron Transistors to Probe Two-electron Systems" Physical Review B, vol. 61, (2000).
Hollenberg et al. "Two-dimensional Architectures for Donor-Based Quantum Computing" Physical Review B, vol. 74, (2006).
Jamieson et al. "Controlled Shallow Single-ion Implantation in Silicon Using an Active Substrate for Sub-20-keV ions" Applied Physics Letters 86, 202101 (2005).
Fuechsle et al. "A Single-atom Transistor" Nature Nanotechnology 7, pp. 242-246 (2012).
Morello et al. "Single-Shot Readout of an Electron Spin in Silicon" arXiv:1003.2679 [cond-mat.mes-hall], (2010).
Elzerman et al. Single-shot read-out of an Individual Electron Spin in a Quantum Dot Letters to Nature, Vol. 430, pp. 431-435 (2004).
Vandersypen et al. "Real-Time Detection of Single-Electon Tunneling Using a Quantum Point Contact" Applied Physics Letters vol. 85, No. 19, pp. 4394-4396 (2004).
Angus et al. "A Silicon Radio-Frequency Single Electron Transistor at 4.2K" Australian Research Council Centre of Excellence for Quantum Computer Technology, University of New South Wales, Sydney, Australia.
Xiao et al. "Electrical Detection of the Spin Resonance of a Single Electron in a Silicon Field-effect Transistor" Letters to nature, vol. 430, pp. 435-439 (2004).
Morello et al. "Architecture for High-Sensitivity Single-Shot Readout and Control of the Electron Spin of Individual Donors in Silicon" arXiv:0904.1271v4 [cond-mat.mes-hall], (2009).
Pla et al. "A Single-Atom Electron Spin Quibit in Silicon" arXiv:1305.4481 [cond-mat.mes-hall], (2013).
Pla et al. "High-Fidelity Readout and Control of a Nuclear Spin Quibit in Silicon" Nature vol. 496, pp. 334-338 (2013).
Barenco et al. "Elementary Gates for Quantum Computation" Physical Review A (AC5710), pp. 1-31 (1995).
Loss et al. "Quantum Computation With Quantum Dots" Physical Review A vol. 57, No. 1, pp. 120-126 (1998).
Wellard et al. "Electron Exchange Coupling for Single-Donor Solid-state Spin Qubits" Physical Review B vol. 68, pp. 1-9 (2003).
Nielsen et al. "A Configuration Interaction Analysis of Exchange in Double Quantum Dots" Sandia National Laboratories, Albuquerque, New Mexico, pp. 1-15 (2013).
Petta et al. "Coherent Manipulation of Coupled Electron Spins in Semiconductor Quantum Dots" downloaded from Sciencemag.org, vol. 309, pp. 2180-2184 (2005).
Van Der Wiel et al. "Electron Transport Through Double Quantum Dots" Reviews of Modern Physics, vol. 75, (2003).
Skinner et al. "Hydrogenic Spin Quantum Computing in Silicon: a Digital Approach" (Jun. 21, 2002).

* cited by examiner

| nuclear spins parallel $\|\Uparrow\Uparrow\rangle$ or $\|\Downarrow\Downarrow\rangle$ | nuclear spins anti-parallel $\|\Uparrow\Downarrow\rangle$ or $\|\Downarrow\Uparrow\rangle$ |
|---|---|
| $\langle\uparrow\downarrow\|H\|\uparrow\downarrow\rangle = \langle\downarrow\uparrow\|H\|\downarrow\uparrow\rangle$ | $\langle\uparrow\downarrow\|H\|\uparrow\downarrow\rangle - \langle\downarrow\uparrow\|H\|\downarrow\uparrow\rangle = A$ | independent of relative magnitudes of $J$ and $A$ $J \gg A$  $\qquad$  $J \ll A$ (a) $\qquad$ (b) $\qquad$ (c)

QUANTUM LOGIC

CROSS-REFERENCE TO RELATED APPLICATIONS

The present application claims priority from Australian Provisional Patent Application No 2012903473 filed on 13 Aug. 2012, the content of which is incorporated herein by reference.

TECHNICAL FIELD

This disclosure concerns quantum logic, in particular a device for performing quantum logic, a method for performing quantum logic and for controlling the exchange interaction between electron spins of a pair of donor electrons.

BACKGROUND ART

A scalable quantum computer could be constructed where quantum information is encoded in the spin of electrons bound to donor atoms in silicon, as described in Ref. [1]. The operation of such a quantum computer involves at least four fundamental steps:
1. The definition and isolation of a physical system that carries the quantum information, which is called a "qubit";
2. The readout of the state of the qubit;
3. The encoding of quantum information on the qubit, that is a 'write' operation;
4. The implementation of a quantum logic operation between two qubits, by means of some controllable interaction;

Definition of the Qubit

A qubit is defined as the quantum state of the spin of an electron bound to an electrically active donor atom that is incorporated into crystalline silicon (Si). An example of a donor atom is phosphorus (P). Other suitable donor atoms include As, Sb, Bi. The deliberate placement of an individual donor atom in Si nanostructures has been demonstrated both by single-ion implantation, as described in Ref. [2] and by scanning probe lithography, as described in Ref. [3].

Readout of a Single Electron Spin

Figure 1:
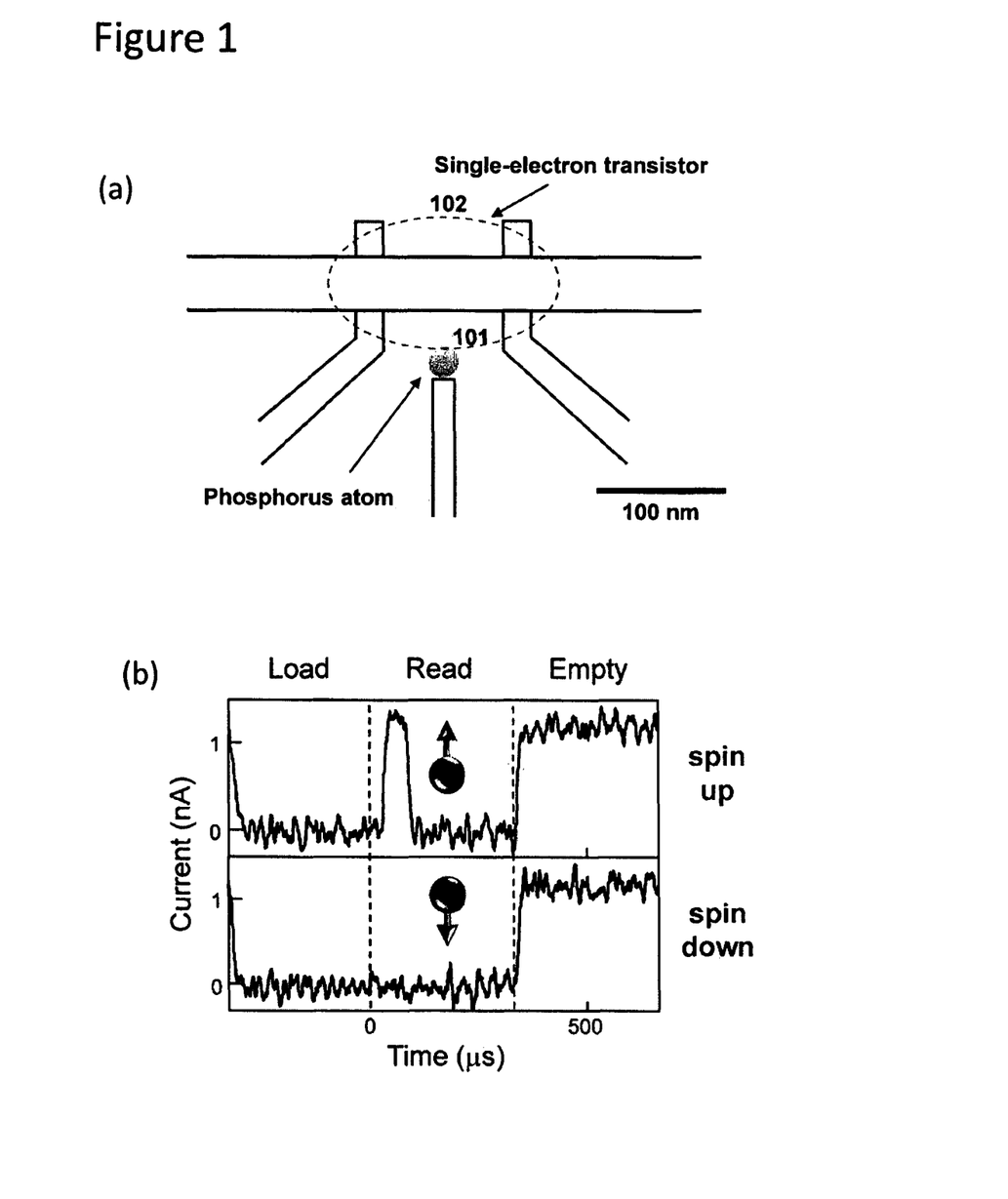
FIG. 1 illustrates a spin readout device for a donor in silicon 101, where the charge detector is a Single-Electron Transistor (SET) 102.

Spin qubit readout will now be discussed with reference to FIG. 1. The ability to read out the state of a single electron spin bound to a donor atom has been demonstrated in Ref. [4]. For this purpose, "spin-dependent tunnelling" is used to achieve readout, as described in Ref. [5]: The donor phosphorus atom 101 is placed in the proximity of a structure that contains a charge reservoir, filled with electrons up to the Fermi energy, $E_F$. The charge reservoir is capable of accepting extra electrons, provided that their energy is higher than the Fermi energy $E_F$. The principle of spin-dependent tunnelling relies on the application of a large magnetic field $B_0$, which splits the energy of the spin-down $|\downarrow\rangle$ and the spin-up $|\uparrow\rangle$ states of electrons by an amount equal to the Zeeman splitting, $E_Z = g\mu_B B_0$, where $g \approx 2$ is the Landé g-factor, and $\mu_B = 9.27 \cdot 10^{-24}$ J/T is the Bohr magneton. If the value of $B_0$ is such that $E_Z \gg k_B T$, where $k_B = 1.38 \cdot 10^{-23}$ J/K is the Boltzmann constant and T is the temperature, then it is possible to create an energetic configuration where only an electron in the $|\uparrow\rangle$ state has sufficient energy to enter the charge reservoir. This configuration will be called "spin readout position" in the following discussion. The definition of spin readout position is based upon the electrochemical potential $\mu$ of the donor with respect to the Fermi energy $E_F$ of the charge reservoir. In the presence of a large magnetic field $B_0$ the electrochemical potentials of the electron become spin-dependent, with $\mu_\uparrow - \mu_\downarrow = E_Z$. The spin readout position is obtained when $\mu_\uparrow > E_F > \mu_\downarrow$.

The physical mechanism through which the electron leaves the donor atom and enters the charge reservoir is quantum mechanical tunnelling, which occurs on a characteristic time scale $\tau_t$. This time scale is of crucial importance. Typical useful values of $\tau_t$ range from 1 μs to 100 ms. The spin state of the electron is detected by placing a charge sensor in the proximity of the donor atom. A charge sensor is a nanostructure that allows the passage of electrical current, in an amount which is very strongly dependent on the electrostatic environment. A well-designed charge sensor is able to detect, in real time, the displacement of a single electron charge in its vicinity, to within distances of order 10-100 nm. Examples of charge sensors include Quantum Point Contacts (QPCs), as described in Ref. [6], Single-Electron Transistors (SETs) 102, as described in Ref. [7], and even ordinary transistors operated at low enough temperature, see Ref. [8]. FIG. 1 shows a SET 102 providing the charge sensor, and it comprises a source, drain and gates as shown in FIG. 1

In a spin readout structure based on spin-dependent tunnelling, the state of the electron spin is assigned as $|\uparrow\rangle$ if the charge sensor detects the displacement of the electron charge, or $|\downarrow\rangle$ otherwise (compare spin-dependent current trace in FIG. 1(b)). A charge sensor 102 used to detect a spin-dependent tunnelling event takes the role of a "spin readout device". It is important to notice that the tunnelling time scale $\tau_t$ has the significance of placing a bound on the speed at which the electron spin state can be detected. If the spin state changes while "waiting" for the tunnelling event to occur on the time scale $\tau_t$, then the readout process is compromised.

Encoding an Arbitrary State on the Qubit

Figure 2:
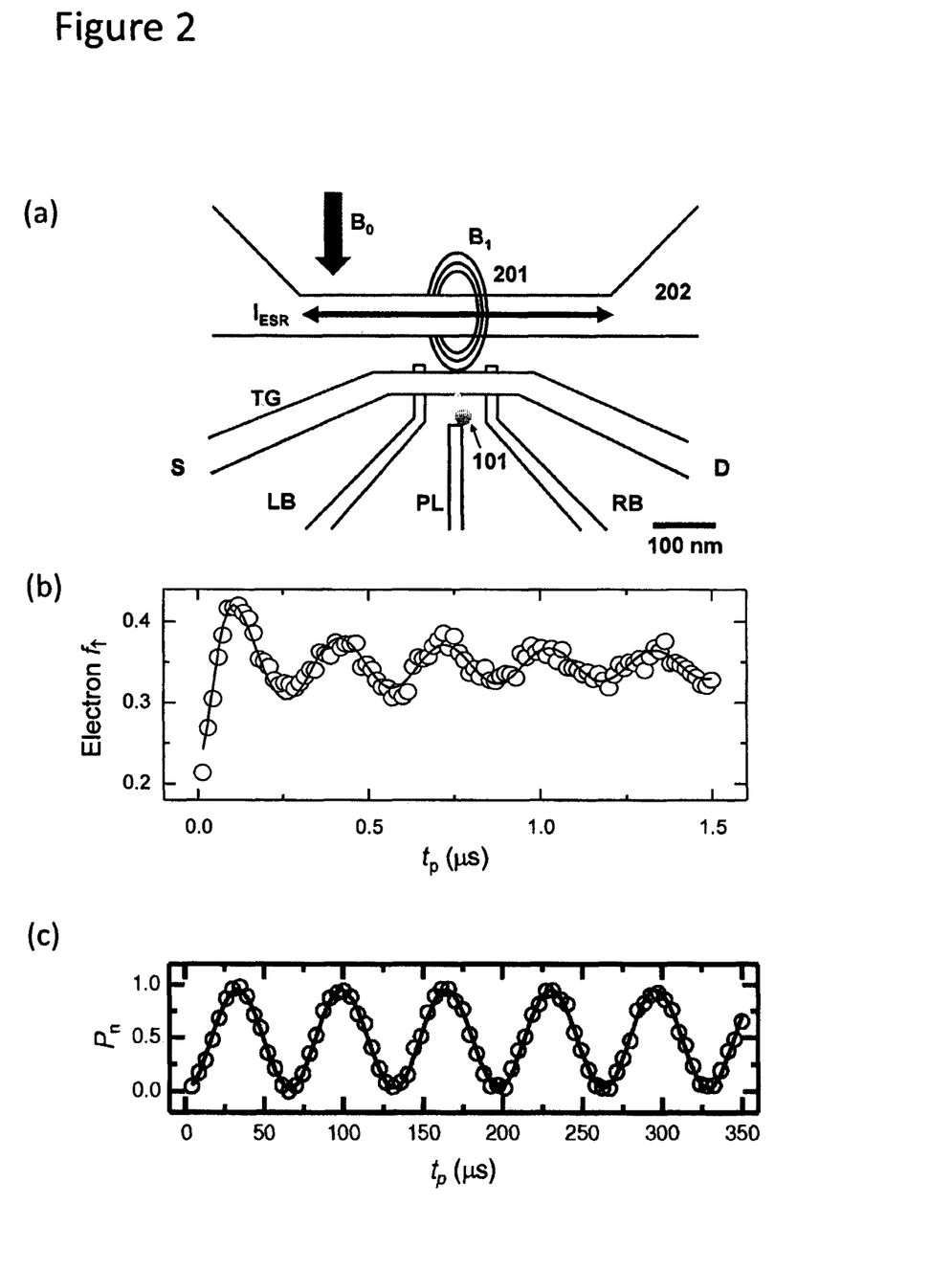
FIG. 2 illustrates a structure where the spin readout device has been integrated with a microwave transmission line 202 to deliver coherent pulses of oscillating magnetic field 201, thereby producing an arbitrary state of the electron and the nuclear spin of a P donor 101.

With reference to FIG. 2, the preparation of an arbitrary state of the electron spin has been demonstrated making use of the technique described in Ref. [9]. The spin can be initialized in the state $|\downarrow\rangle$ by using the same spin-dependent tunnelling process described above, but in reverse, where an electron from the charge reservoir tunnels onto the donor atom. Arbitrary quantum superposition states, of the form $|\Psi\rangle = \alpha|\downarrow\rangle + \beta|\uparrow\rangle$, with $\alpha^2 + \beta^2 = 1$, are then created by applying pulses of oscillating magnetic field 201 at the frequency corresponding to the natural precession frequency of the electron spin, described by Ref. [10].

In addition to the electron spin, donor atoms also possess a nuclear spin, which is magnetically coupled to the electron through the hyperfine interaction A. Different donor atoms have different nuclear spin values, e.g. ½ for P, 3/2 for As, 5/2 or 7/2 for Sb, and 9/2 for Bi. P is the simplest, since it can be described in the simple basis of nuclear spin up $|\Uparrow\rangle$ or down $|\Downarrow\rangle$ states, but the discussion below is applicable to all donors. The nuclear spin can also be read out and controlled with very high fidelity, as recently demonstrated for a P nucleus by Ref. [11]. All together, the current state of the art allows initializing and controlling the spin state of both the electron and the nuclear spin of single donor atoms in silicon.

Quantum Logic Operations

The next fundamental step for the construction of a functional and scalable quantum computer is the realization of quantum logic gates between pairs of qubits. A universal quantum computer can be built on the basis of single-qubit rotations (already demonstrated, see above), together with two-qubit gates such as the CNOT gate described by Ref. [12], where a qubit is rotated or not, depending on the state of the other. It has been shown that a CNOT gate can be obtained from a combination of single-qubit rotations together with the $\sqrt{\text{SWAP}}$ gate described by Ref. [13]. Physically, the $\sqrt{\text{SWAP}}$ gate can be implemented naturally with qubits based on electron spins, by introducing a magnetic interaction between the spins, called "exchange interaction", with strength indicated by J. Two electron spins coupled by exchange interaction and prepared initially e.g. in the state $|\downarrow\uparrow\rangle$, will evolve in time towards the state $|\uparrow\downarrow\rangle$ and back (this is known as "exchange oscillations"), with a period $\tau_J=h/j$ where $h=6.64\cdot10^{-34}$ J·s is the Planck constant. The typical period of the exchange oscillation between donors at a distance of order 20 nm is $\tau_J \approx 0.1$-1 ns. The evolution from $|\downarrow\rangle$ to $|\uparrow\downarrow\rangle$ is a full SWAP gate, whereas the $\sqrt{\text{SWAP}}$ is obtained by stopping halfway, i.e. interrupting the exchange oscillations after an evolution time $\tau_{\sqrt{SWAP}}=h/4j$.

An early proposal for donor-spin-based quantum computer in silicon as described by Ref. [14] suggested the use and control of the exchange interaction as the physical resource for two-qubit gates. It was proposed there that the value of J can be tuned by applying a voltage to an electrostatic gate placed laterally between the two donor atoms. The physical mechanism for this relies upon modifying the electron wavefunctions, and therefore their overlap, on which the value of J depends. Subsequent theoretical work further investigated the dependence off on the distance between the donors 301 and 302, and on the voltage on a gate 303 placed between them, described by Ref. [15]. A sketch of the envisaged device structure is shown in FIG. 3(*a*), and a calculation of the value off as a function of inter-donor distance is shown in FIG. 3(*b*).

Figure 3:
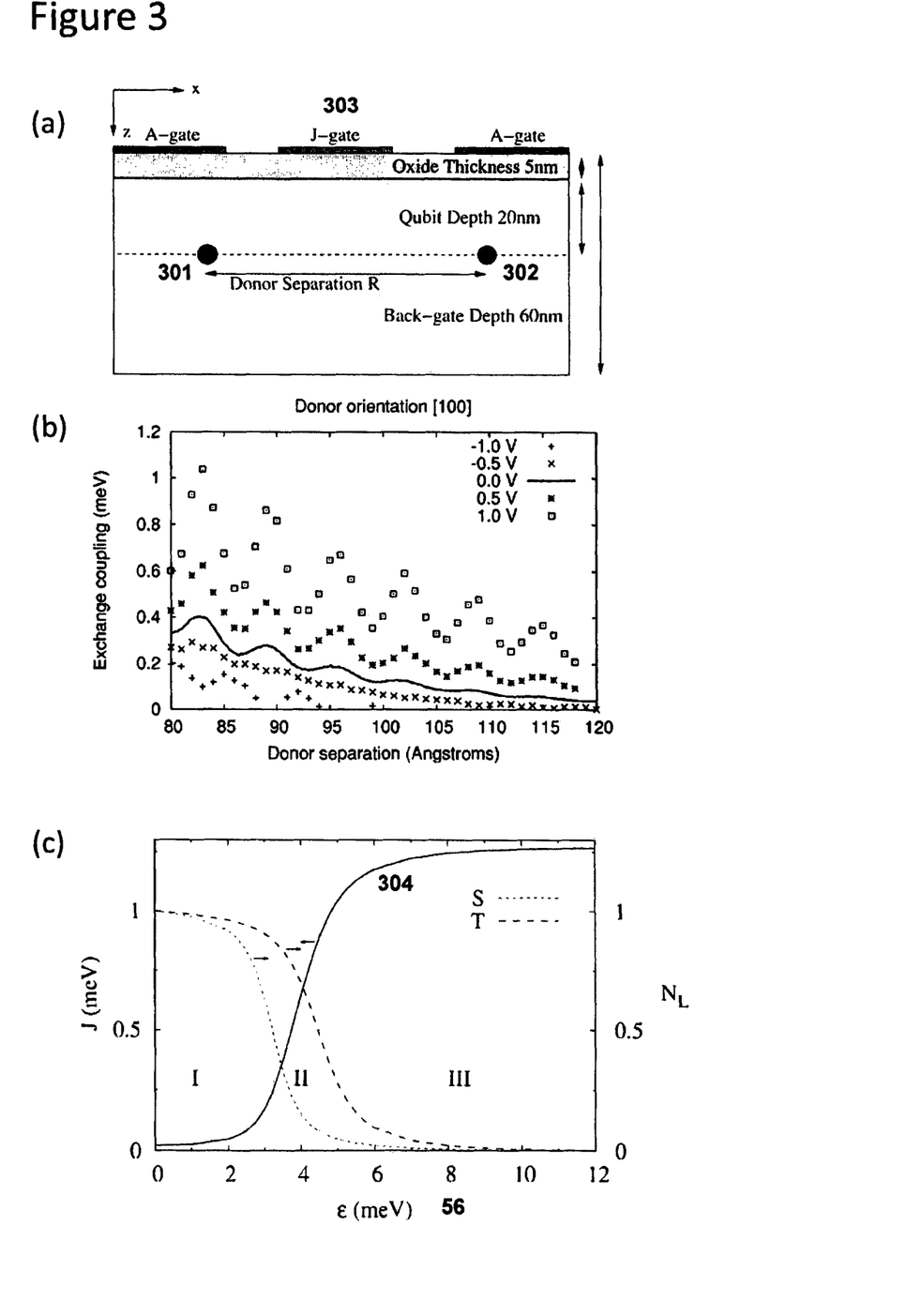
FIG. 3 summarizes the prior state of the theory of exchange interaction between electron spins, and their tunability.

A difficulty with achieving control of the exchange interaction between donors and the observation of exchange oscillations arises for the structure shown in FIG. 3(*a*), by the need to reconcile the exchange oscillation timescale $\tau_J$ with the spin readout and tunnelling timescale $\tau_t$. As discussed above, the time necessary to read out the state of a spin is at least 1 µs, which is 3-4 orders of magnitude longer than the period of the exchange oscillations. Observing such oscillations experimentally with sufficient contrast therefore requires "freezing" the exchange interaction, and therefore the spin states of the electrons, by reducing the value of J by at least 5 orders of magnitude. This is an extremely stringent requirement, which is not likely to be implemented soon. In addition, the requirements on lithography, alignment and nanofabrication to place an electrostatic gate 303 in between two donors are extremely demanding. It would be much more convenient to tune J in a different manner.

With reference to FIG. 3(*c*), an alternative way to tune the exchange interaction is to apply a strong electric field along the axis that joins the donors [16], thereby creating a difference in electrochemical potential between the donors, which we call "detuning" $\in$. Increasing $\in$ has the effect of increasing J without requiring the fabrication of an electrostatic gate precisely in between the two donors. However, the dynamic range of J obtained like this is still not likely to reach the required 5 orders of magnitude mentioned above.

Disclosure

There is provided a method for controlling exchange oscillations between a pair of electron spin states in a quantum computation device comprising a pair of donor atoms incorporated in crystalline silicon, wherein each donor atom has a nucleus and at least one bound electron. Quantum information is encoded in a spin state of the nucleus and/or the bound electron of the donor atoms, and the spin state of the nucleus of each donor atom is coupled to the spin state of its respective bound electron via the hyperfine interaction (A), an exchange interaction (J) between the spin state of each of the two electrons results in exchange oscillations between them, and wherein the nuclear spins of the donor atoms are prepared in opposite states. The exchange interaction (J) is tuned by the application of a switchable voltage to selectively change the relative strength of the exchange interaction with respect to the hyperfine interaction and, thereby selectively controlling the exchange oscillations between the two bound electrons.

Tuning the exchange interaction (J) between the donor electron spins may be achieved by modifying the relative potential of the two donor atoms. Alternatively, the step of controlling the exchange interaction (J) between the donor electron spins may be achieved by modifying the potential barrier between the two donor atoms.

The amplitude of the exchange oscillations between the two bound electrons may be made larger or smaller, depending on the tuning of the exchange interaction (J) with respect to the hyperfine interaction (A). The exchange between the two bound electrons may, therefore, be turned on or suppressed. This is in contrast to reducing the frequency of exchange oscillations such that the state does not change within the readout timescale $\tau_t$.

The method for controlling (switching) the effect of the exchange interaction (J) between donor electron spins, may enable to perform a quantum logic operation between two electron spins by tuning the exchange interaction (J) relative to the hyperfine interaction (A), and preparing the nuclear spins in opposite states, such that the exchange operation takes place while J>>A, whereas exchange is stopped to allow the readout of the results while J<<A.

The method may be performed in the context of two qubit exchange gate operations. For instance for performing SWAP operations between the electron spins of two donors in silicon, or for performing $\sqrt{\text{SWAP}}$ operations between the electron spins of two donors in silicon.

The method may comprise the steps of:
(readout and antiparallel) initialization of the nuclear spins
initialization of the electron spins
exchange operation between the electrons
readout of the final electron spins states Wherein, the exchange operation is controlled by the application of a switchable voltage to selectively modify the relative energy of the two bound electrons or modify the potential barrier in between them.

An electron reservoir may be provided to facilitate initialisation. An electrometer may be provided to determine a charge state of a donor atom. A single electron Transistor (SET) may be provided for readout. The Single Electron Transistor (SET) may be tunnel-coupled to the donor atoms. Upon application of a magnetic field read-out may involve spin dependent quantum mechanical tunnelling of a donor electron in the higher energy spin state to a charge reservoir.

The method may comprise the step of detuning to protect against unwanted exchange oscillations during a two qubit exchange operations.

There is provided a quantum computing device for controlling exchange oscillations between a pair of electron spin states in a quantum computation device. The device comprising a pair of donor atoms incorporated in crystalline silicon, wherein each donor atom has a nucleus and at least one bound electron. Quantum information is encoded in a spin state of the nucleus and/or the bound electron of the donor atoms, and the spin state of the nucleus of each donor atom is coupled to the spin state of its respective bound electron via the hyperfine interaction (A). An exchange interaction (J) between the spin states of the two electrons results in exchange oscillations between them; and tuning the exchange interaction (J) may involve the application of a switchable voltage which selectively changes the relative strength of the exchange interaction with respect to the hyperfine interaction. As a result there may be selective control of the exchange oscillations between the two bound electrons when the nuclear spins are prepared in opposite spin states.

There is also provided a large scale quantum device comprising plural such devices fabricated on a common silicon wafer.

The invention is a method to switch on and off the exchange oscillations between electron spins bound to donor atoms, with only a modest requirement on the tunability of the exchange interaction J (2 orders of magnitude are sufficient), by exploiting the hyperfine coupling A between the electrons and the donor nuclei, and the ability to prepare the nuclear spins in any desired state.

Taking as example the P donor, the hyperfine interaction has strength (in frequency units) A=117 MHz. The invention relies upon two things:
- the ability to prepare the nuclear spins of a donor in any desired state, by means of radiofrequency pulses. This has been experimentally demonstrated [11]. For the discussion below, we will seek to prepare the two nuclei in opposite spin state, e.g. $|\Downarrow\Uparrow\rangle$ ;
- the ability to tune the exchange interaction between two donors in the range (in frequency units) J≈10 MHz-1 GHz, i.e. a factor 10 lower or higher than A. The required range of exchange interaction strength is within the values that theory predicts to be achievable [15,16].

If the nuclear spins are initially prepared in opposite states, e.g. $|\Downarrow\Uparrow\rangle$, a value of J≈1 GHz>>A is sufficient to allow free exchange oscillations with period of order 1 ns. Switching J to ≈10 MHz<<A has the effect of freezing out the exchange oscillations for a long enough time so that a spin readout device placed in the vicinity of the qubit can observe the spin state created by the two-qubit gate, without deterioration of the spin state during the wait time.

Figure 5:
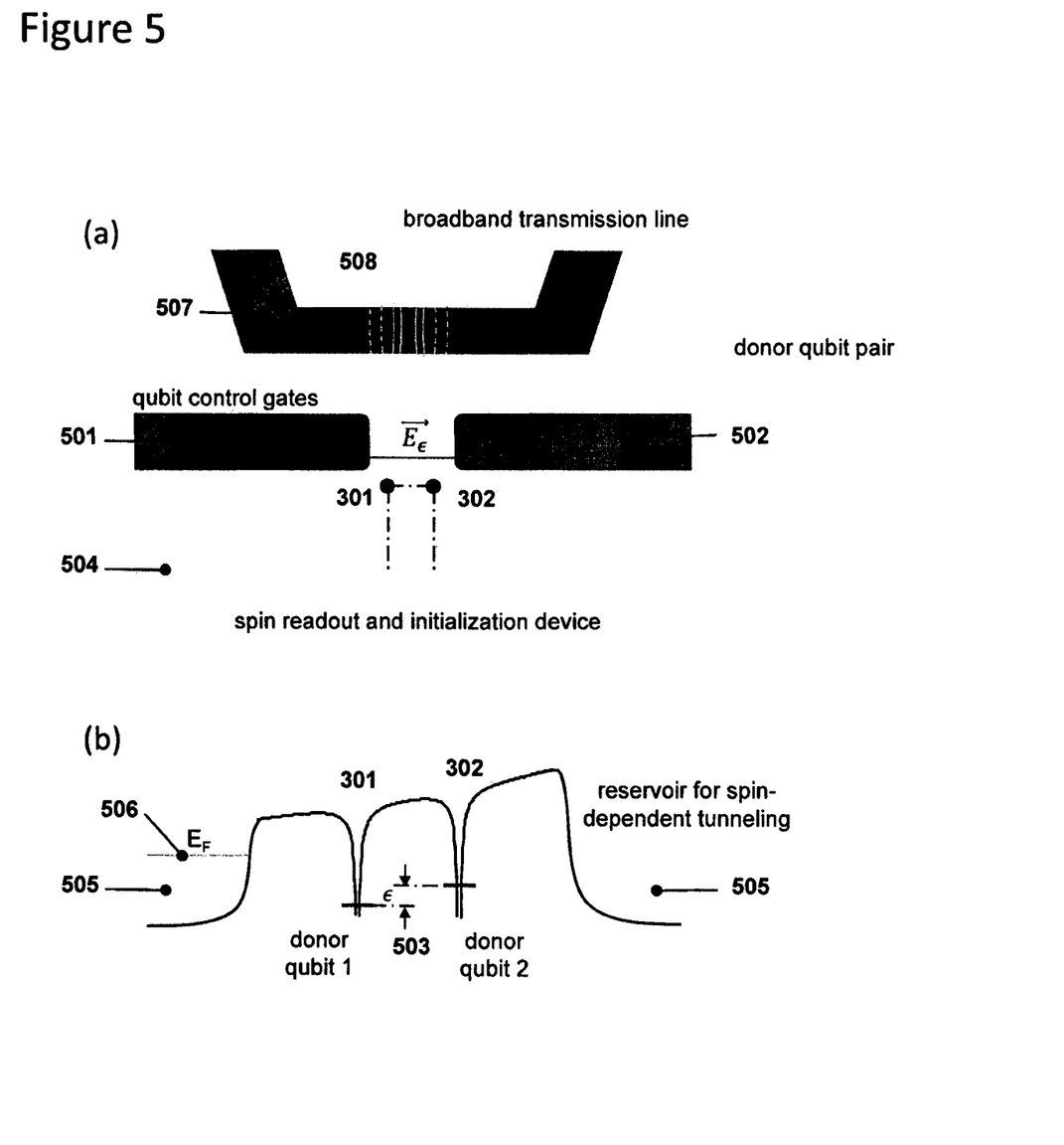
FIG. 5 illustrates a first device for performing quantum logic.

Tuning J by 2 orders of magnitude can be achieved by using two gates 501, 502 on each side of the donor pair 301, 302 instead of a gate 303 placed precisely between the donors. These two gates can be tuned to produce an electric field along the axis that joins the donors in the pair. The physical mechanism by which J can be tuned is not directly a modification of the wavefunction overlap, but a modification of the relative energy (known as "detuning", $\in$ 503) of the two donor electrons, which also enters in the value of J. Some calculations of J versus $\in$ have been performed in the case of quantum dots in silicon [16], and show that the tunability range is expected to be sufficient.

BRIEF DESCRIPTION OF THE DRAWINGS

The prior art has been described above with reference to the accompanying drawings, in which:

FIG. 1(a) is a schematic image of the device, with labels to indicate the expected location of a donor 101, and the single-electron transistor 102.

FIG. 1(b) is an example of two real-time traces of the current through the SET, where in one case the electron is spin-up, giving rise to a single pulse of current during the 'read' phase, while in the other case the electron is spin-down, giving no current signal. From Ref. [4]

FIG. 2(a) is a schematic image of the device.

FIG. 2(b) is a plot of the experimentally observed "Rabi oscillations" of the electron spin, i.e. the demonstration of the ability to rotate the electron spin from $|\downarrow\rangle$ to $\beta|\uparrow\rangle$ and back, at will. From Ref. [10].

FIG. 2(c) is a plot of the experimentally observed "Rabi oscillations" of the nuclear spin, i.e. the demonstration of the ability to rotate the nuclear spin from $|\Downarrow\rangle$ to $|\Uparrow\rangle$ and back, at will. From Ref. [11].

FIG. 3(a) is a sketch of the architecture that has been proposed and analysed in the prior art to control the exchange between donor electron spins. The value of J is tuned by the voltage on the "J-gate" 303 as illustrated. From Ref. [15].

FIG. 3(b) is a plot of the calculated value of J as a function of distance between the donors 301 and 302, for different values of the voltage on the J-gate, as indicated. From Ref. [15].

FIG. 3(c) is a graph of calculated values of J for electrons in a double quantum dot, as a function of the energy detuning $\in$ represented as solid line 304. From Ref. [16].

FIG. 4(a) shows the Coulomb potential that can bind one (neutral $D^0$ state 401) or two (negatively charged $D^-$ state 402) electrons to the donor atom. The $D^-$ state 402 is a singlet state with total spin S=0, therefore insensitive to magnetic fields. Conversely, the $D^0$ state 401 has spin S=½. The combined effect of the hyperfine interaction A with the donor nucleus and the Zeeman interaction $E_Z$ splits the $D^0$ state in four electro-nuclear states 403, 404, 405, 406.

FIG. 4(b) shows a larger sketch of the energies and spin configurations of the electro-nuclear states 403, 404, 405, 406. The arrows 407 and 408 mark the energy difference between states of different electron spin. In an electron spin resonance (ESR) experiment, these transitions can be driven with a microwave pulse of corresponding frequency.

FIG. 4(c) sketches the energy levels 409, 410 of the donor nucleus when there is no extra electron bound to the donor, forming the positively charged $D^+$ state 411. The energy difference 412 between states of different nuclear spin is much smaller than 407 or 408 in (b). This transition can be driven by a radiofrequency pulse of corresponding frequency in a nuclear magnetic resonance (NMR) experiment.

Examples of the invention will now be described with reference to the accompanying drawings, in which:

FIG. 5(a) is a plan view of the first device.

FIG. 5(b) is a graph of the energy landscape of the first device, along the dash-dotted line drawn in FIG. 5(a).

FIG. 6(a) illustrates the case when the nuclear spins of the two donors are in the same state, $|\Uparrow\Uparrow\rangle$ or $|\Downarrow\Downarrow\rangle$. The exchange interaction can make the electron spins "rotate" (i.e. perform a SWAP operation) from the $|\uparrow\downarrow\rangle$ to the RT) state, around the equator of the Bloch sphere having the singlet and triplet states at the poles.

FIG. 6(b) illustrates the case when the nuclear spins of the two donors are in the opposite state, $|\Downarrow\Uparrow\rangle$ or $|\Uparrow\Downarrow\rangle$, and J>>A. The effect of the Hyperfine interaction A due to having opposite nuclear spin states is visualized as having a slight component of detuning field along the x-axis, which slightly tilts the axis of rotation of the electron spin states away from the equator. The effect is however very small and high-fidelity exchange oscillations can be obtained.

FIG. 6(c) illustrates the case when the nuclear spins of the two donors are in the opposite state, $|\Downarrow\Uparrow\rangle$ or $|\Uparrow\Downarrow\rangle$, and J<<A. In this case, A dominates completely and makes it impossible for the electron spins state to rotate around the equator. Therefore, the electron state only performs small oscillations around the $|\uparrow\downarrow\rangle$ point on the equator.

FIG. 7(a) the main panel, quantifies the maximum probability that the two electron spins undergo an exchange SWAP, as a function of the $\log_{10}$ of the ratio J/A.

FIG. 7(b) shows the calculated time evolution of the spin projections along the z-axis at a particular value of J/A>>1 as indicated. The calculated time evolution reflects the case, illustrated in FIG. 6(b).

FIG. 7(c) shows the calculated time evolution of the spin projections at a particular value of J/A<<1 as indicated. The calculated time evolution reflects the case illustrated in FIG. 6(c).

BEST MODES OF THE INVENTION

Referring first to FIG. 5(a), the device for performing quantum logic, includes a spin readout device 504, placed in proximity to two donors 301, 302. The distance between donors and spin readout device 504 is such that quantum tunnelling of an electron is possible between each of the donors 301 and 302 and the spin readout device 504. Referring now to FIG. 5(b) the spin readout device 504 comprises an electron reservoir 505 (for instance the island of a single-electron transistor, or a 2-dimensional electron gas), whose Fermi level $E_F$ 506 will determine the electrochemical potential at which the donor electron becomes readable.

The electrochemical potential of the donors is controlled by the voltage $V_{D1}$ on the electrostatic gate 501 (for the left donor 301) and $V_{D2}$ on gate 502 (for the right donor 302). If $V_{D1} \neq V_{D2}$ an electric field $E_\in$ exists between the donors. This leads to a detuning $\in$ 503 between the electrochemical potentials of the two donors. As shown in FIG. 3(c), the detuning $\in$ 503 is responsible for increasing the value of the exchange interaction J.

A broadband microwave transmission line 507 can be used to deliver microwave—for electron spin resonance (ESR)—and radio-frequency—for nuclear magnetic resonance (NMR)—pulses of oscillating magnetic field 508. Other structures, such as resonant cavities and NMR coils, can be employed for the same purpose.

Time Evolution of the Electron Spin States

Figure 6:
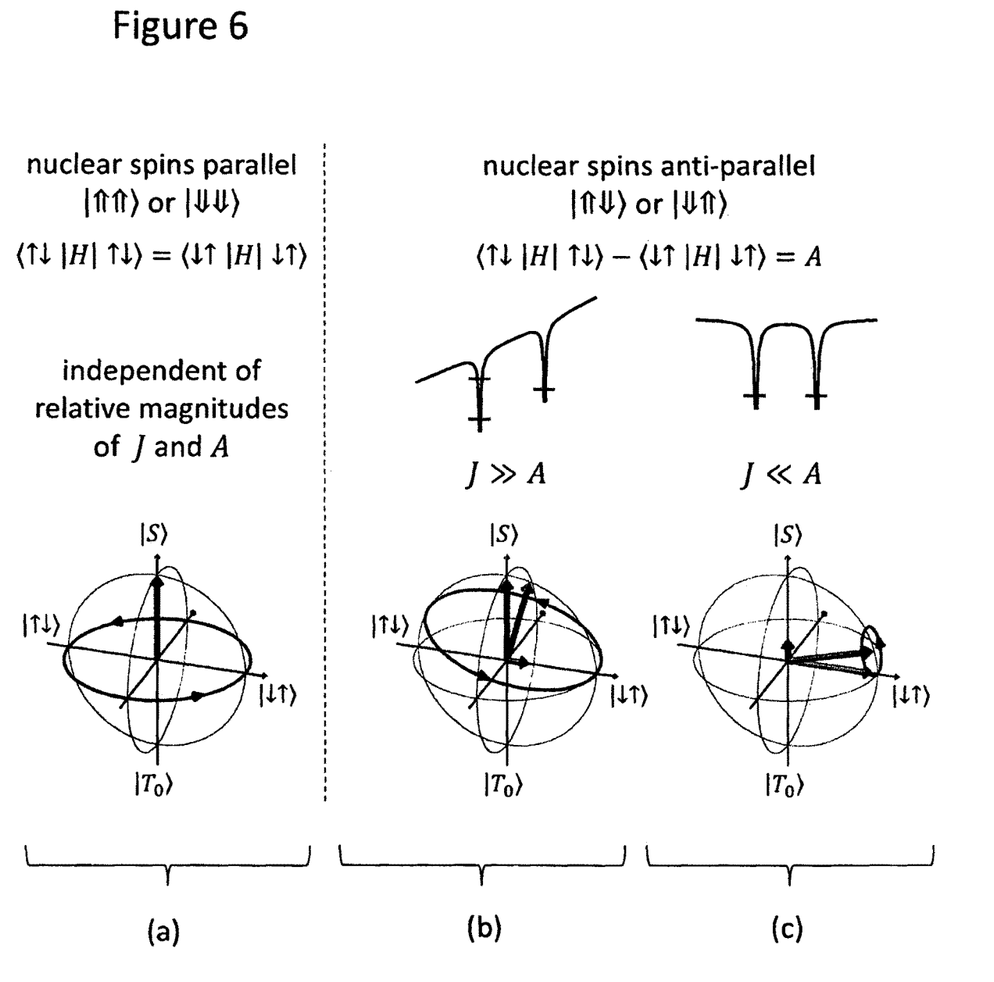
FIG. 6 illustrates pictorially the possible modes of operation of the device.

Referring now to FIG. 6, we describe the time evolution of the spin states of the electrons bound to two donor atoms, under the combined effect of a. hyperfine interaction A and an exchange interaction J.

It is convenient to use the well-known nomenclature for the two-donor electron spin states, where we call:

$$1/\sqrt{2}(|\downarrow\uparrow\rangle - |\uparrow\downarrow\rangle) = |S\rangle \quad \text{"singlet state"}$$

$$|\downarrow\downarrow\rangle = |T_-\rangle$$

$$1/\sqrt{2}(|\downarrow\uparrow\rangle + |\uparrow\downarrow\rangle) = |T_0\rangle \quad \text{"triplet states"}$$

$$|\uparrow\uparrow\rangle = |T\rangle$$

Considering now the case where only combinations of the $|\downarrow\uparrow\rangle$ and $|\uparrow\downarrow\rangle$ states are relevant, we can depict the time evolution of the coupled donor electron spins on a single "Bloch sphere" where the state $|S\rangle$ is at the North pole, the state $|T_0\rangle$ is at the South pole and the states $|\downarrow\uparrow\rangle$ and $|\uparrow\downarrow\rangle$ are on the equator.

In this representation, the difference in hyperfine field $\Delta B_A$ between the two donors can be depicted as a fictitious magnetic field along the x-axis, while the exchange field $B_J$ acts as a fictitious magnetic field along the z-axis. The two-electron spin state therefore evolves by a precession around the vector sum of the two fields arising from the combined action of $\Delta B_A$ and $B_J$. This type of representation, and the corresponding time evolution, have been discussed and demonstrated in previous work described by Ref. [17]. There, however, the hyperfine field arises from the presence of a large number (of order $10^6$) of nuclear spins coupled to the electron, confined in a quantum dot. Such hyperfine field can be treated classically from a mathematical point of view, and cannot be controlled on short time scales, from an experimental point of view. The present device makes use of the fact that the nuclear spin of a donor atom is a quantum object, and can be controlled quickly and reliably with NMR techniques see FIG. 2(c) of Ref. [11].

Considering first the case when the nuclear spins are in the same state, i.e. $|\Downarrow\Downarrow\rangle$ or $|\Uparrow\Uparrow\rangle$, as in FIG. 6(a), the hyperfine field difference is $\Delta B_A = 0$. Therefore only the exchange field $B_J$ is active. Electron spins prepared e.g. in the state $|\downarrow\uparrow\rangle$ will rotate along the equator of the Bloch sphere and reach $|\uparrow\downarrow\rangle$ after some time. This rotation constitutes a SWAP operation. An entangled state of the two electrons can be obtained by stopping halfway between $|\downarrow\uparrow\rangle$ and $|\uparrow\downarrow\rangle$, performing what is known as a $\sqrt{SWAP}$ operation.

If instead the nuclear spins are prepared in opposite states, i.e. $|\Downarrow\Uparrow\rangle$ or $|\Uparrow\Downarrow\rangle$, then $\Delta B_A \neq 0$. The evolution of the electron spins will depend on the relative magnitude of A and J. For J>>A (FIG. 6(b)), as can be obtained with a large detuning $\in$ 503, the electron spin evolution is similar to the case of FIG. 6(a), because $B_J$ prevails over $\Delta B_A$. Conversely, for J<<A (FIG. 6(c)), as can be obtained with a small detuning $\in$ 503, $\Delta B_A$ prevails over $B_J$ and the electron spin state is unable to rotate around the equator. Therefore, the state of the two electron spins is frozen or, more precisely, the component of the two-electron spins state along the x-axis (the one that joins the $|\downarrow\uparrow\rangle$ and $|\uparrow\downarrow\rangle$ states) is constant in time. This is the ideal situation to read out the state of the electron spins with the spin readout device 504.

Figure 7:
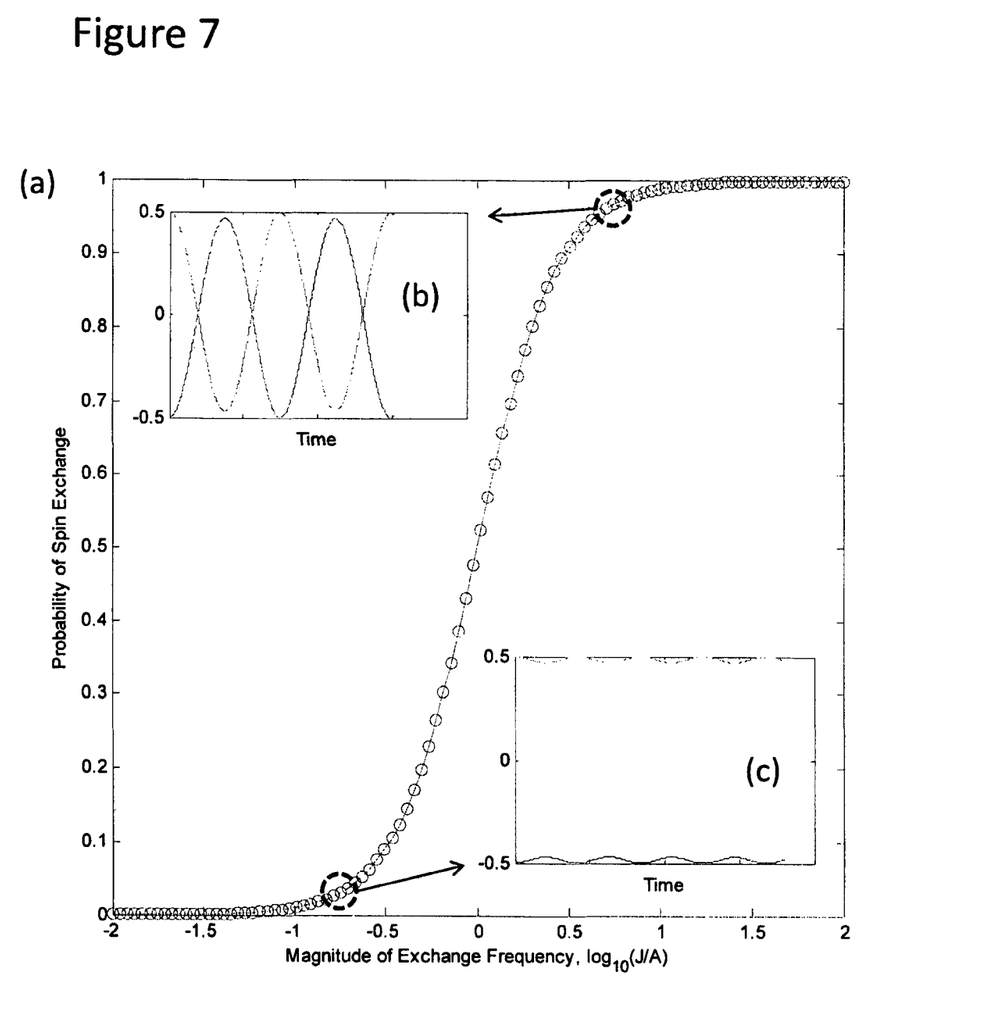
FIG. 7 shows the results of the exact calculation of the time evolution of the electron spin states.

FIG. 7(a) shows quantitatively the probability that electron spins prepared in the $|\downarrow\uparrow\rangle$ state will exchange to the $|\uparrow\downarrow\rangle$ state, as a function of the ratio J/A. The insets (b) and (c) depict the exact time evolution of the electron spin states at the two limits J>>A and J<<A, respectively. Therefore, FIG. 7(b) corresponds to the sketch in FIG. 6(b), and FIG. 7(c) corresponds to FIG. 6(c).

Pulse Sequence to Control and Observe Exchange Oscillations

Figure 8:
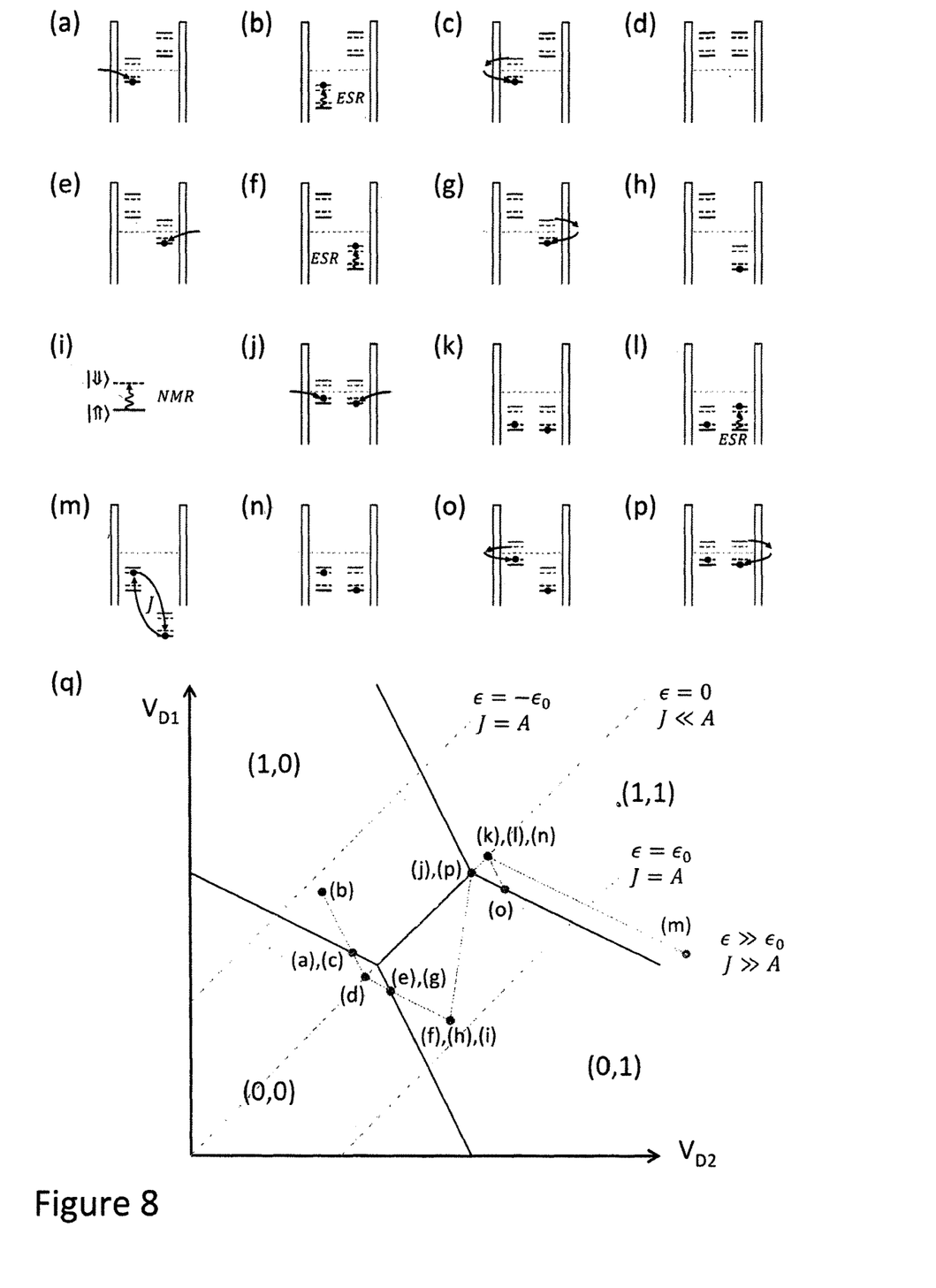
FIG. 8 is a summary of the sequence of gate and spin resonance pulses necessary to demonstrate the functionality of the invention in a simple device as shown in FIG. 5.

Referring now to FIG. 8, we describe the complete protocol to initialize, operate and read out the state of two donor-bound electrons subject to exchange and hyperfine interactions.

Figure 4:
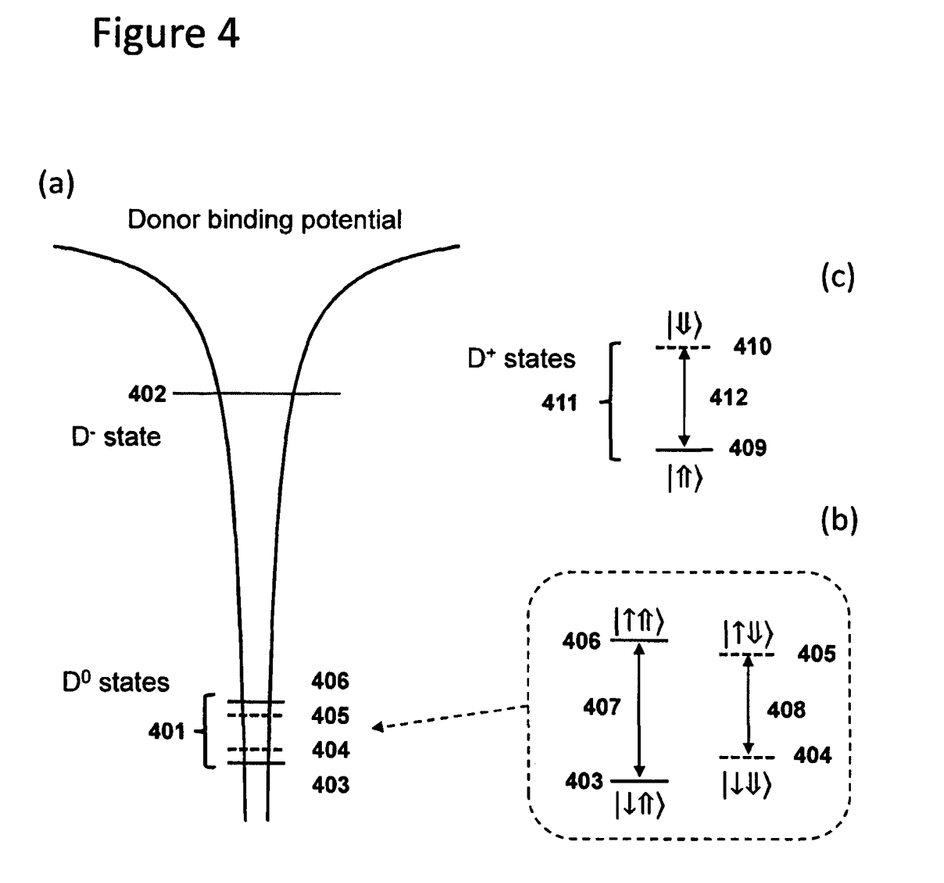
FIG. 4 is a series of diagrams depicting the relevant energy levels of the donor depending on the state of the nuclear and electron spins, and the charge occupancy.

The protocol can be broken down into four main parts:
  i. Readout and initialization of the nuclear spins
  ii. Initialization of the electron spins
  iii. Exchange operation between the electrons
  iv. Readout of the final electron spins states Below we describe each phase involved in the protocol, referring to the sketches in FIG. 8.

i. Read and Initialization of the Nuclear Spins
  (a) Start with both donors ionized, i.e. in the $D^+$ state 411 (FIG. 4), and lower the energy of the left donor 301 to the readout level, where the electrochemical potential of the electron spin-up states $|\uparrow\rangle$ 405, 406 is higher than the Fermi energy 506 of the electron reservoir 505, and the electrochemical potential of the electron spin-down states $|\downarrow\rangle$ 403, 404 is lower. Here a $|\downarrow\rangle$ electron is loaded onto the left donor 301.
  (b) The electrochemical potential of the left donor 301 is lowered such that all spin states are below the Fermi energy 506. This is a safe position to apply a microwave excitation to the donor-bound electron, since the electron cannot escape. Depending on the nuclear spin state, the electron will have one of two possible ESR frequencies 407, 408. In the example sketched here we assume that the nuclear spin is $|\Uparrow\rangle$, i.e. the electro-nuclear state $|\downarrow\Uparrow\rangle$ is loaded on the left donor 301. We assume here that only one ESR frequency is probed, e.g. 407 in this case.
  (c) The potential of the left donor 301 is brought back to the readout position. If the ESR frequency applied during phase (b) matched the resonance of the electron spin, the electron has been excited to the $|\uparrow\Uparrow\rangle$ state 406, escapes the donor and gives a readable signal to the spin readout device 504. The escaped $|\uparrow\rangle$ electron is shortly thereafter replaced by a $|\downarrow\rangle$ electron. The knowledge that the donor responded to the ESR frequency 407 yields the information that the nuclear spin is in the $|\Uparrow\rangle$ state.
  (d) Ionize the left donor 301.
  (e) Load $|\downarrow\rangle$ electron on right donor 302
  (f) Lower the potential of the right donor 302 and probe the ESR frequency 407 on it.
  (g) Read out the electron spin state on the right donor 302 and assess whether the nuclear spin is in the $|\Uparrow\rangle$ state. In the example shown here, that is the case.
  (h) At this point, we have observed that both donors have nuclear spins in the $|\Uparrow\rangle$ state. This corresponds to the case sketched in FIG. 6(a), where the exchange interaction is undisturbed by hyperfine fields, and cannot be switched off. The goal is to exploit the ability to switch the spin exchange on and off by preparing the nuclear spins in opposite state. This is done by lowering the potential of the right donor 302, and keeping that of the left donor 301 high, so that the left donor 301 remains ionized, i.e. in the $D^+$ state 411.
  (i) The left donor 301 now responds to a unique NMR excitation frequency 412, which does not match any transition frequency of the right donor 302. We can therefore switch the left nuclear spin to the state $|\Downarrow\rangle$. This operation can be done quickly and with high fidelity by using either a π-pulse or adiabatic inversion.

ii. Initialization of the Electron Spins
  (j) Load a $|\downarrow\rangle$ electron on both the left donor 301 and the right donor 302. At this point, the two-donor system has been initialized in the nuclear state $|\Downarrow\Uparrow\rangle$ and electron state $|\downarrow\downarrow\rangle$.
  (k) Lower the potential of both donors so that it is safe to apply ESR pulses.
  (l) Prepare the electron spin state $|\downarrow\uparrow\rangle$. This is possible by applying an ESR pulse at the frequency 407. Only the right donor 302 will respond to this frequency, because the left donor 301 has been prepared in the nuclear state $|\Uparrow\rangle$, so it would only respond to the ESR frequency 408.

iii. Exchange Operation between the Electrons
  (m) In all of the steps described above, the detuning $\in$ 503 of the electrochemical potential of the two donor electrons was kept very small, yielding the condition J<<A. This corresponded to the sketches in FIGS. 6(c) and 7(c). Now we switch on the exchange interaction by pulsing the electrochemical potentials such that the detuning $\in$ 503 becomes very large and yields J>>A. This corresponds to the sketches in FIGS. 6(b) and 7(b). The duration of time spent at this point determines the rotation angle along the equator of the Bloch sphere.
  (n) After the desired exchange time, the spin exchange is switched off again, by bringing the donors at the same potential, i.e. setting $\in$=0. The spins no longer evolve in time, and from this "frozen" configuration they can be brought to the readout position to verify the result of the exchange operation.

iv. Readout of the Final Electronic Spin States
  (o) The left donor 301 is brought to the spin readout position, and its state is measured.
  (p) The right donor 302 is brought to the spin readout position, and its state is measured.

FIG. 8(q) shows the complete sequence of operations, drawn on the charge stability diagram [18] of the two-donor system. This diagram represents the stable configuration of donor charges as a function of the voltages on the donor gates 501, 502. Each of the sketches described above corresponds to a specific point on this diagram. The diagram also highlights the diagonal line where the electrochemical potential of the two donors is identical, i.e. the detuning 503 is $\in$=0. This corresponds to the minimum value of J. We also highlight the lines where the detuning has a value $\in_0$ such that J=A. Beyond these lines we reach the regime J>>A, which is where the exchange operation (m) is performed.

Integration of the Two-Qubit Logic Gate with a Larger Quantum Computer Architecture A scalable and fault-tolerant architecture for a quantum computer based on donor electron spins has been proposed by Ref. [1]. It comprises all the components discussed above, such as: Donor electron spins; Spin readout devices; Microwave pulses to control the spin state; Two-qubit logic gates based on the exchange interaction; In addition, it proposes the use of rails of ionized donors along which the electrons can be moved from one interaction zone to the other, or to the spin readout device.

The device and method disclosed here can be integrated with the architecture published in Ref. [1] with no difficulty. The only requirement is that, every time one wishes to read out the state of an electron spin, the electron needs to be transported to the nearest spin readout device, by moving it along a rail of ionized donors. Therefore, all the steps for the preparation and demonstration of a two-qubit gate using the invention can be used as described, with the only addition of extra electron transport steps.

In a scaled-up quantum computer architecture, it is not always necessary to initialize the electron spins to the $|\downarrow\uparrow\rangle$ state as in FIG. 8(*l*), but electrons can be brought to the interaction zone after they have undergone previous quantum logic operations. This does not change the mode of operation, other than removing the need for the steps (j,k,l) described above. The steps of initializing the nuclear spins of the donors in the interaction region remain necessary and can be performed as described, with the aforementioned addition of a phase of electron transport to the spin readout device every time the electron spin needs to be measured.

REFERENCES

The following references are incorporated herein by reference:
[1] L. C. L. Hollenberg, A. D. Greentree, A. G. Fowler, and C. J. Wellard, Phys. Rev. B 74, 045311 (2006).
[2] D. N. Jamieson, C. Yang, T. Hopf, S. M. Hearne, C. I. Pakes, S. Prawer, M. Mitic, E. Gauja, S. E. Andresen, F. E. Hudson, A. S. Dzurak, and R. G. Clark, Appl. Phys. Lett. 86, 202101 (2005).
[3] M. Fuechsle, J. A. Miwa, S. Mahapatra, H. Ryu, S. Lee, O. Warschkow, L. C. L. Hollenberg, G. Klimeck and M. Y. Simmons, Nature Nanotech. 7, 242 (2012).
[4] A. Morello et al., Nature 467, 687 (2010)
[5] J. M. Elzerman, R. Hanson, L. H. Willems van Beveren, B. Witkamp, L. M. K. Vandersypen, and L. P. Kouwenhoven, Nature 430, 431 (2004).
[6] L. M. K. Vandersypen, J. M. Elzerman, R. N. Schouten, L. H. Willems van Beveren, R. Hanson, and L. P. Kouwenhoven, Appl. Phys. Lett. 85, 4394 (2004).
[7] S. J. Angus, A. J. Ferguson, A. S. Dzurak, and R. G. Clark, Appl. Phys. Lett. 92, 112103 (2008).
[8] M. Xiao, I. Martin, E. Yablonovitch and H. W. Jiang, Nature 430, 435 (2004)
[9] A. Morello, C. C. Escott, H. Huebl, L. H. Willems van Beveren, L. C. L. Hollenberg, D. N. Jamieson, A. S. Dzurak, and R. G. Clark, Phys. Rev. B 80, 081307(R) (2009).
[10] J. J. Pla, K. Y. Tan, J. P Dehollain, W. H. Lim, J. J. L. Morton, D. N. Jamieson, A. S. Dzurak and A. Morello, Nature 489, 541 (2012).
[11] J. J. Pla, K. Y. Tan, J. P Dehollain, F. A. Zwanenburg, W. H. Lim, J. J. L. Morton, D. N. Jamieson, A. S. Dzurak and A. Morello, Nature 496, 334 (2013).
[12] A. Barenco et al., Phys. Rev. A 52, 3457 (1995).
[13] D. Loss and D. P. diVincenzo, Phys. Rev. A 57, 120 (1998).
[14] B. E. Kane, Nature 393, 133 (1998).
[15] C. J. Wellard, L. C. L. Hollenberg, F. Parisoli, L. M. Kettle, H.-S. Goan, J. A. L. McIntosh and D. N. Jamieson, Phys. Rev. B 68, 195209 (2003).
[16] E. Nielsen and R. P. Muller, preprint at <http://arxiv.org/abs/1006.2735>
[17] J. R. Pena et al., Science 309, 2180 (2005).
[18] W. G. van der Wiel et al., Rev. Mod. Phys. 75, 1 (2003).

The invention claimed is:

1. A method for controlling exchange oscillations between a pair of electron spin states in a quantum computation device comprising a pair of donor atoms incorporated in crystalline silicon, wherein each donor atom has a nucleus and at least one bound electron;
wherein, quantum information is encoded in a spin state of the bound electron of each donor atom of the pair of donor atoms, and the spin state of the nucleus of each donor atom is coupled to the spin state of its respective bound electron via the hyperfine interaction (A);
and wherein an exchange interaction (J) between the spin state of each of the two electrons results in exchange oscillations between them;
the method comprising the steps of:
preparing the nuclear spins of the two donors in opposite states by preparing a first donor of the two donors in a first state and a second donor of the two donors in a second state that is opposite to the first state;
tuning the exchange interaction (J) by the application of a switchable voltage to selectively change the relative strength of the exchange interaction with respect to the hyperfine interaction; and thereby selectively controlling the exchange oscillations between the two bound electrons to perform a quantum logic operation between the quantum information encoded on the spin state of the bound electron of each donor atom.

2. The method according to claim 1, comprising the step of tuning the exchange interaction (J) between the donor electron spins, by modifying the relative potential between the two donor atoms.

3. The method according to claim 1, comprising the step of controlling the exchange interaction (J) between the donor electron spins, by modifying the potential barrier between the two donor atoms.

4. The method according to claim 1, wherein the exchange oscillations between the two bound electrons are turned on or off; depending on the tuning of the exchange interaction (J).

5. The method according to claim 1, wherein the amplitude of the exchange oscillations between the two bound electrons is made higher or lower; depending on the tuning of the exchange interaction (J).

6. The method according to claim 1, wherein the method is performed in the context of two qubit exchange gate operations.

7. The method according to claim 6, for performing SWAP operations between the electron spins of two donors in silicon.

8. The method according to claim 6, for performing $\sqrt{\text{SWAP}}$ operations between the electron spins of two donors in silicon.

9. The method according to claim 1, wherein an electron reservoir is provided to facilitate initialization.

10. The method according to claim 1, wherein an electrometer is provided to determine a charge state of a donor atom.

11. The method according to claim 1, wherein a Single Electron Transistor (SET) is provided for readout.

12. The method according to claim 11, wherein the Single Electron Transistor (SET) is tunnel-coupled to the donor atoms.

13. The method according to claim 1, wherein preparing the nuclear spins of the two donors in opposite states comprises performing read-out and control of the state of the nuclear spins of the donor atoms.

14. The method according to claim 1, for performing a quantum logic operation between two electron spins by tuning the exchange interaction (J) relative to the hyperfine interaction (A), and preparing the nuclear spins in opposite states, such that quantum logic operations take place while J>>A, whereas the quantum logic operations are stopped to allow the readout of the results while J<<A.

15. The method according to claim 13 wherein read-out involves spin dependent quantum mechanical tunneling of a donor electron in the 'spin-up' state to a charge reservoir upon application of a magnetic field.

16. The method according to claim 1, comprising the steps of:
   initialization of the nuclear spins in opposite states;
   initialization of the electron spins;
   exchange operation between the electrons; and,
   readout of the final electron spins states;
   wherein, the exchange operation is tuned by the application of a switchable electric field between a pair of 'J' gates to selectively modify the relative energy of the two bound electrons.

17. The method according to claim 1, comprising the step of detuning to protect against unwanted exchange oscillations during a two qubit exchange operations.

18. A quantum computing device for controlling exchange oscillations between a pair of electron spin states in a quantum computation device comprising:
   a pair of donor atoms incorporated in crystalline silicon, wherein each donor atom has a nucleus and at least one bound electron;
   wherein, quantum information is encoded in a spin state of the bound electron of the donor atoms, and the spin state of the nucleus of each donor atom is coupled to the spin state of its respective bound electron via the hyperfine interaction (A);
   and wherein an exchange interaction (J) between the spin state of each of the two electrons results in exchange oscillations between them;
   and wherein the nuclear spins of the two donors are prepared in opposite states such that a first donor of the two, donors is in a first state and a second donor of the two donors is in a second state that is opposite to the first state;
   and further wherein tuning the exchange interaction (J) by the application of a switchable voltage selectively changes the relative strength of the exchange interaction with respect to the hyperfine interaction; and thereby selectively controls the exchange oscillations between the two bound electrons to perform a quantum logic operation between the quantum information encoded on the spin state of the bound electron of each donor atom.

19. A large scale quantum device comprising plural devices according to claim 18 fabricated on a common silicon wafer.

* * * * *

UNITED STATES PATENT AND TRADEMARK OFFICE
CERTIFICATE OF CORRECTION

PATENT NO. : 10,878,331 B2
APPLICATION NO. : 14/420979
DATED : December 29, 2020
INVENTOR(S) : Andrea Morello, Rachpon Kalra and Arne Laucht It is certified that error appears in the above-identified patent and that said Letters Patent is hereby corrected as shown below:

In the Specification

Column 2, Line 43 Should read: -- form $|\Psi\rangle = \alpha|\downarrow\rangle + \beta|\uparrow\rangle$, with $\alpha^2 + \beta^2 = 1$, are then created by Column 4, Line 58 Should read: -- Preparing the nuclear spins of the two donors in opposite states may comprise performing read-out and control of the state of the nuclear spins of the donor atoms.

Column 6, Line 11 Should read: -- the ability to rotate the nuclear spin from $|\Downarrow\rangle$ to $|\Uparrow\rangle$ and Column 7, Line 1 Should read: -- a *SWAP* operation) from the $|\uparrow\downarrow\rangle$ to the $|\downarrow\uparrow\rangle$ state, around Column 8, Lines 40-42 Should read: -- $B_J$ is active. Electron spins prepared e.g. in the state $|\downarrow\uparrow\rangle$ will rotate along the equator of the Bloch sphere and reach $|\uparrow\downarrow\rangle$ after some time. This rotation constitutes a *SWAP*

Column 10, Line 2 Should read: -- (j) Load a $|\downarrow\rangle$ electron on both the left donor 301 and the Signed and Sealed this
Twenty-second Day of February, 2022

Drew Hirshfeld
*Performing the Functions and Duties of the*
*Under Secretary of Commerce for Intellectual Property and*
*Director of the United States Patent and Trademark Office*